(12) United States Patent
Han et al.

(10) Patent No.: US 11,083,115 B2
(45) Date of Patent: Aug. 3, 2021

(54) APPARATUS FOR COOLING POWER DEVICE OF POWER CONDITIONING SYSTEM

(71) Applicant: Hyosung Heavy Industries Corporation, Seoul (KR)

(72) Inventors: Chang Woo Han, Goyang-si (KR); Seung Boong Jeong, Seoul (KR); Moon Ho Lee, Uiwang-si (KR); Joon Hong Boo, Goyang-si (KR)

(73) Assignee: Hyosung Heavy Industries Corporation, Seoul (KR)

( * ) Notice: Subject to any disclaimer, the term of this patent is extended or adjusted under 35 U.S.C. 154(b) by 125 days.

(21) Appl. No.: 16/472,434

(22) PCT Filed: Dec. 14, 2017

(86) PCT No.: PCT/KR2017/014715
§ 371 (c)(1),
(2) Date: Jun. 21, 2019

(87) PCT Pub. No.: WO2018/117534
PCT Pub. Date: Jun. 28, 2018

(65) Prior Publication Data
US 2020/0375071 A1 Nov. 26, 2020

(30) Foreign Application Priority Data
Dec. 23, 2016 (KR) .................. 10-2016-0177657

(51) Int. Cl.
*G06F 1/16* (2006.01)
*H05K 5/00* (2006.01)
(Continued)

(52) U.S. Cl.
CPC ..... *H05K 7/20936* (2013.01); *H05K 7/20309* (2013.01); *H05K 7/20318* (2013.01); *H05K 7/20336* (2013.01)

(58) Field of Classification Search
CPC .......... H05K 7/20936; H05K 7/20309; H05K 7/20318; H05K 7/20336
See application file for complete search history.

(56) References Cited

U.S. PATENT DOCUMENTS

2005/0252235 A1* 11/2005 Critoph .................. F25B 17/00
62/480
2010/0118493 A1* 5/2010 Huang ............... H05K 7/20936
361/700
(Continued)

FOREIGN PATENT DOCUMENTS

KR 10-0831604 B1 5/2008
KR 10-2011-0022531 A 3/2011
(Continued)

*Primary Examiner* — Anthony M Haughton
(74) *Attorney, Agent, or Firm* — Novick, Kim & Lee, PLLC; Jae Youn Kim

(57) ABSTRACT

The present invention relates to an apparatus for cooling a power device of a power conditioning system. To this end, the present invention comprises: a power device; an evaporator butted to the power device; and a modularized condenser which is connected with the evaporator, placed on the power device, and equipped on the upper side of the power conditioning system. Accordingly, the present invention may easily secure a space, make it easy to install, and increase heat emission performance of the condenser so as to keep the power device at a low temperature, thereby enabling the system to be stably operated over a long period of time.

4 Claims, 5 Drawing Sheets

(51) Int. Cl.
*H05K 7/00* (2006.01)
*H05K 7/20* (2006.01)

(56) References Cited

U.S. PATENT DOCUMENTS

| | | | |
|---|---|---|---|
| 2013/0155616 A1* | 6/2013 | Tong | H05K 7/20909 361/696 |
| 2013/0188315 A1* | 7/2013 | Konishide | H05K 7/20936 361/700 |
| 2014/0076517 A1* | 3/2014 | Toth | F28D 15/0275 165/67 |
| 2016/0352242 A1* | 12/2016 | Takabayashi | H05K 7/20336 |
| 2016/0353606 A1* | 12/2016 | Ryoo | H05K 7/20936 |
| 2017/0084515 A1* | 3/2017 | Shintani | H01L 23/36 |
| 2017/0156240 A1* | 6/2017 | Silvennoinen | H05K 7/20936 |
| 2017/0234623 A1* | 8/2017 | Fried | H05K 7/20809 165/104.26 |
| 2017/0250659 A1* | 8/2017 | Lin | H05K 7/209 |
| 2018/0352684 A1* | 12/2018 | Crouch | H05K 7/1432 |

FOREIGN PATENT DOCUMENTS

| | | |
|---|---|---|
| KR | 10-2012-0074245 A | 7/2012 |
| KR | 10-2010-0049418 A | 5/2016 |
| KR | 10-2016-0073182 A | 6/2016 |

\* cited by examiner

APPARATUS FOR COOLING POWER DEVICE OF POWER CONDITIONING SYSTEM

FIELD OF THE INVENTION

The present invention relates to an apparatus for cooling a power device of a power conditioning system; and more particularly, to enabling the system to be stably operated over a long period of time with greater output at a size same as an existing product by improving performance of the apparatus for cooling the power device.

BACKGROUND OF THE INVENTION

In general, a power conditioning system, or PCS, which has various heating elements including a switching element, a transformer, and an insulated gate bipolar mode transistor (IGBT), needs an apparatus for cooling heat generated from the elements.

To cool a power device, i.e., an IGBT module, one of main components of the power conditioning system, air-cooled, water-cooled, and refrigerant cooling devices have been used but the air-cooled one had a lot of difficulties to secure a space because it was much bigger than the other types of devices even though it could be stably operated.

DETAILED EXPLANATION OF THE INVENTION

Objects of the Invention

An object of the present invention is to make it easy to secure a space and install by modularizing and downsizing an evaporator and a condenser with a power device to cool the power device of a power conditioning system and enable the system to be stably operated over a long period of time by preventing foreign substances from flowing inside from outside and increasing heat emission performance of the condenser so as to keep the power device at a low temperature.

Means of Solving the Problem

The present invention comprises: a power device; an evaporator butted to the power device; and a modularized condenser which is connected with the evaporator, placed on the power device, and equipped on the upper side of the power conditioning system.

In addition, a liquid refrigerant which is injected into, and sealed in, the heat pipe at a vacuum state located in the evaporator, absorbs heat generated from the power device and evaporates into air even at a low temperature. The refrigerant whose phase has changed into gas in the heat pipe located in the evaporator moves to the condenser through the hollow heat pipe. The gaseous refrigerant moving to the condenser may emit heat to the air through a heat dissipation plate located in the condenser and change liquid to gas and the liquid refrigerant of the condenser is circulated to the evaporator along the inner wall of the heat pipe.

Besides, the condenser is composed of: a condenser casing; multiple rows of heat pipe equipped in the condenser casing; and multiple layers of heat dissipation plates connecting the heat pipe.

Furthermore, the condenser casing has an entrance through which outside air flows inside and an exit through which exchanged heat is emitted outside in a form where only one side and the other side are open and reinforced flanges are formed at an edge of the entrance and that of the exit.

Besides, the heat pipe is arranged repeatedly in a zigzag pattern inside the condenser casing and the condenser casing has width longer than height.

Furthermore, the heat pipe is arranged vertically in the condenser casing.

In addition, the heat dissipation plates made of thin sheet-shaped panels have through-holes of the same diameter as the heat pipe at a location identical to the arrangement of the heat pipe and the heat pipe is inserted into, and combined with, the through-holes through forced indentation and soldering.

Moreover, the heat dissipation plates have ring spacers of the same diameter protruding upward or downward as the heat pipe at a location identical to the arrangement of the heat pipe and the heat pipe is inserted into, and combined with, the ring spacers through soldering.

Furthermore, the heat dissipation plates have splined holes of the same diameter protruding upward or downward as the heat pipe at a location identical to the arrangement of the heat pipe and the heat pipe is inserted into, and combined with, the splined holes through soldering.

Besides, the heat dissipation plates have lots of convex or concave surfaces.

Effects of the Invention

The present invention may bring an effect of being capable of easily securing a space by modularizing and downsizing an evaporator and a condenser with a power device.

Besides, it may bring an effect of easily installing a power conditioning system.

Furthermore, it may have an effect of increasing cooling performance and response speed of the power device of the power conditioning system.

Moreover, it may have an effect of being capable of stably operating the system to keep the power device at a low temperature over a long period of time.

Besides, it may bring an effect of preventing foreign substances from being in contact with the power device even though the power conditioning system is installed outdoors.

DETAILED DESCRIPTION OF THE PREFERRED EMBODIMENTS

Detailed example embodiments to implement the present invention will be explained below by referring to attached drawings.

Upon explanation of the present invention, terms such as "a first," "a second," etc. may be used to explain a variety of components but the components may not be limited by such terms. The terms are used only for the purpose of distinguishing one component from another. For example, a first component may be named as a second component without being beyond the scope of the right of the present invention and similarly, even a second component may be named as a first one.

If it is mentioned that a component is connected or linked to another component, it may be understood that the component may be directly connected or linked to the another component but also a third component may exist in between them.

The terms used in this specification are used only to explain specific example embodiments and they are not intended to limit the present invention. Unless a context clearly indicates a different meaning, any reference to singular may include plural ones.

In this specification, it may be understood: that terms such as "include," or "equip" are intended to designate that features, numbers, steps, movements, components, parts, or their combinations exist; and that existence or addibility of one or more other features, numbers, steps, movements, components, parts, or their combinations are not excluded in advance.

For clearer explanation, shapes, sizes, etc. of elements in drawings, moreover, may be exaggerated clearer explanation.

Figure 1:
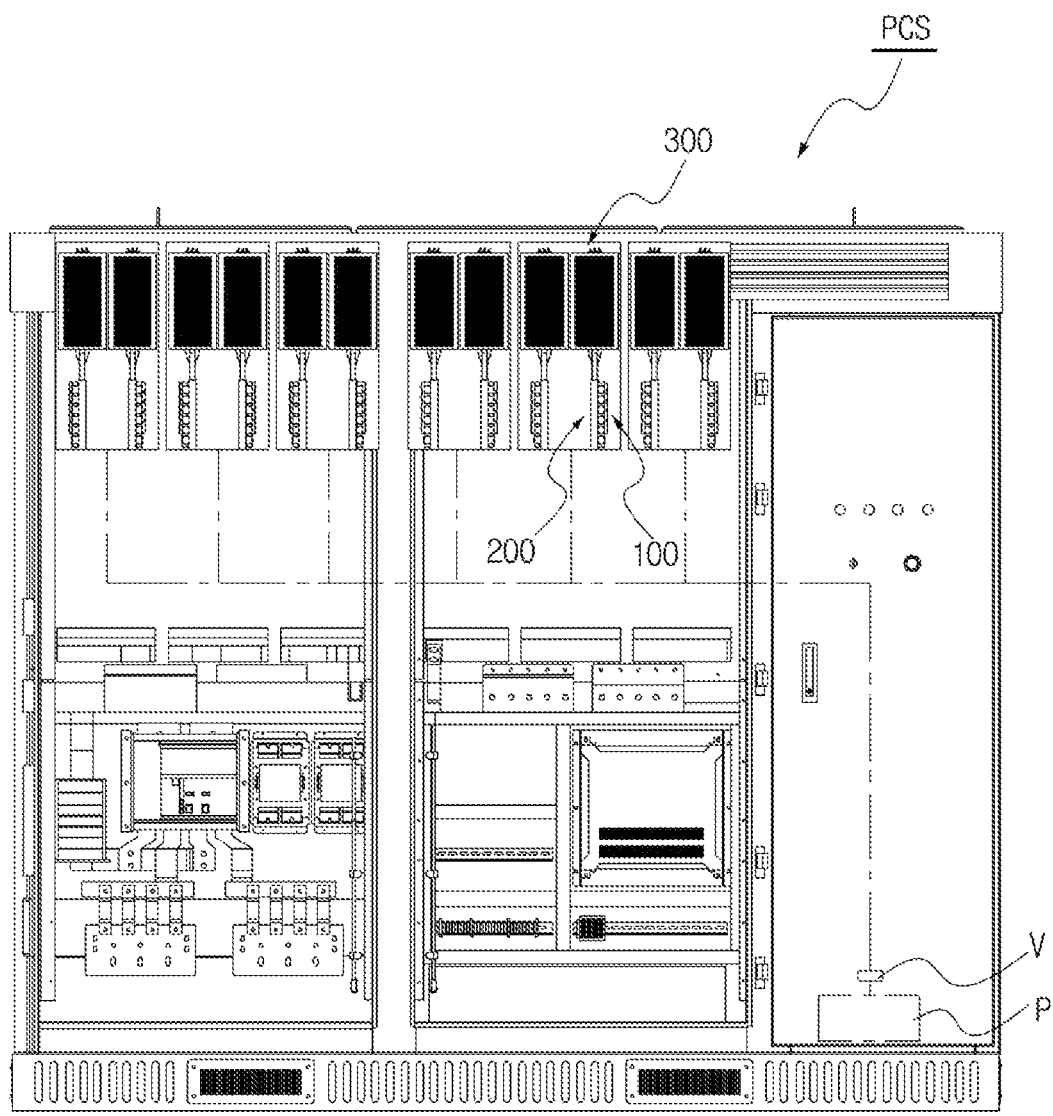
FIG. 1 is a front view illustrating a power conditioning system in which an apparatus for cooling a power device is installed in accordance with the present invention.
Figure 2:
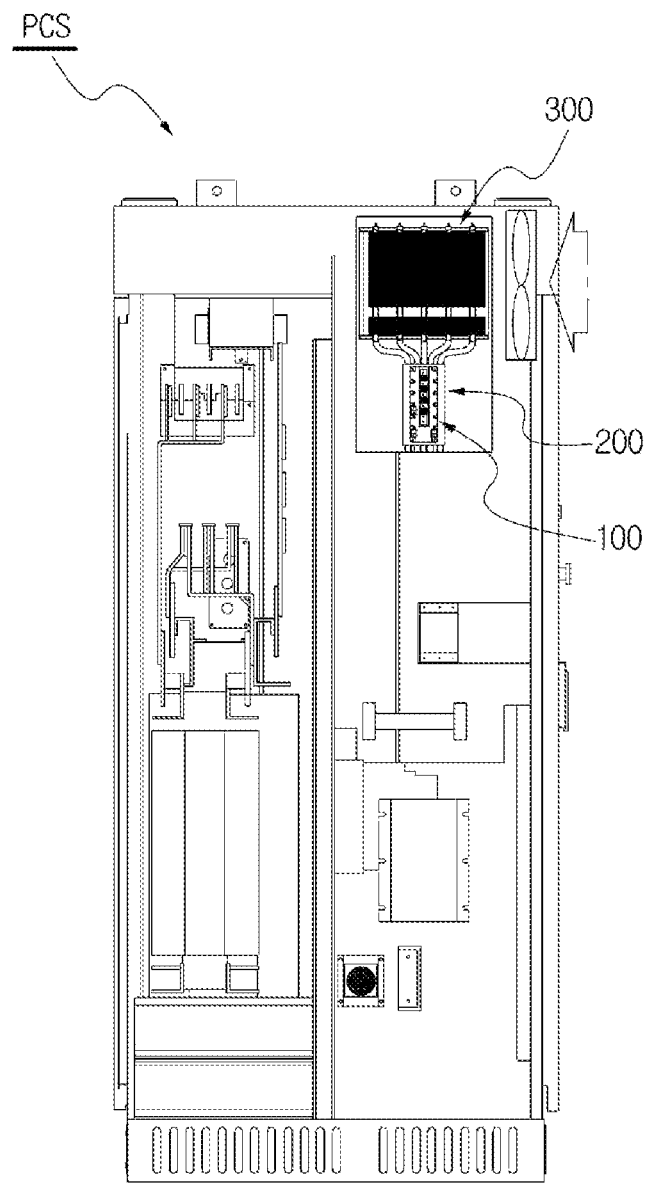
FIG. 2 is a side view illustrating a power conditioning system in which an apparatus for cooling a power device is installed in accordance with the present invention.
Figure 3:
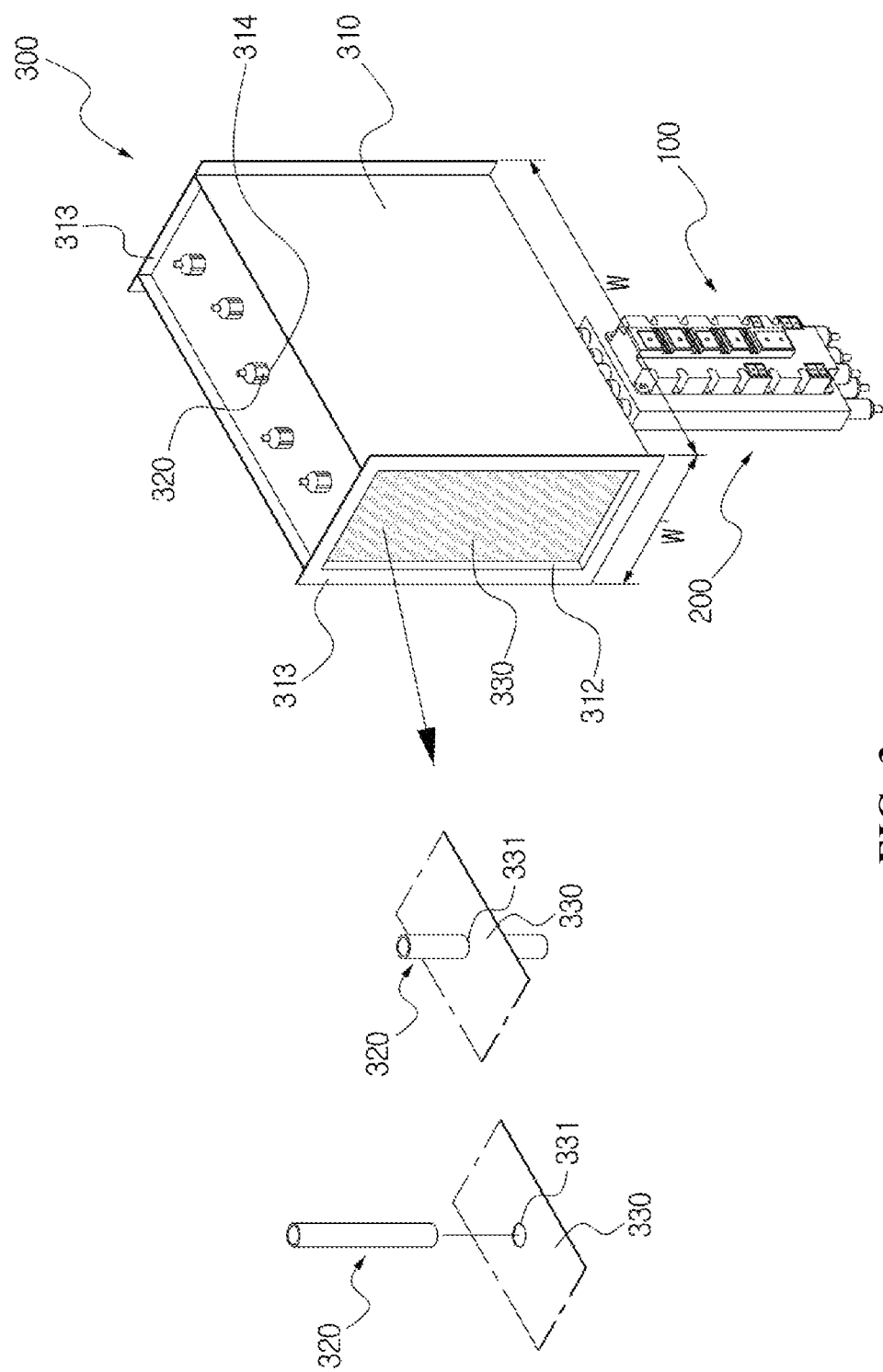
FIG. 3 is a perspective view illustrating an apparatus for cooling a power device in accordance with the present invention.
Figure 4:
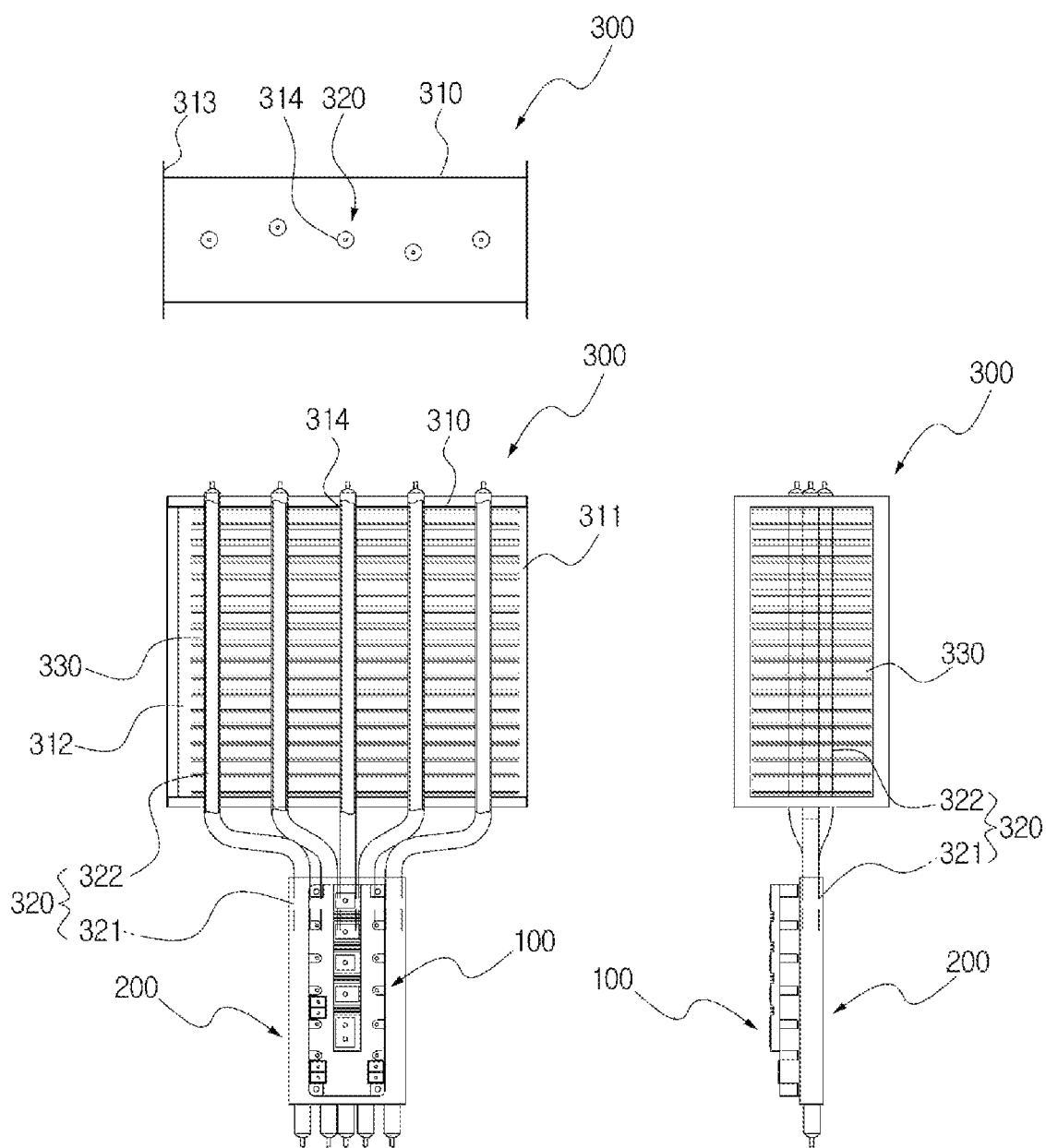
FIG. 4 is examples of a front view, a side view, and a sectional plan illustrating an apparatus for cooling a power device in accordance with the present invention.

FIG. 1 is a front view illustrating a power conditioning system in which an apparatus for cooling a power device is installed in accordance with the present invention and FIG. 2 is a side view illustrating a power conditioning system in which an apparatus for cooling a power device is installed in accordance with the present invention. FIG. 3 is a perspective view illustrating an apparatus for cooling a power device in accordance with the present invention and FIG. 4 is examples of a front view, a side view, and a sectional plan illustrating an apparatus for cooling a power device in accordance with the present invention.

The apparatus for cooling the power device in accordance with the present invention is to make it easy to secure a space and install and enable the system to be stably operated over a long period of time by increasing heat emission performance of the condenser so as to keep the power device at a low temperature. As illustrated in FIGS. 1 to 3, a power device 100, an evaporator 200, and a condenser 300 are modularized and equipped on the upper side of the power conditioning system.

Herein, the power device 100 as a heating element equipped in an ordinary power conditioning system generates considerable heat in a process of operation.

The evaporator 200 butted to the power device 100 is equipped to prevent the system from being overloaded by keeping heat generated from the power device 100 at less than a certain temperature by fully exchanging heat.

Because a liquid refrigerant is injected into, and sealed in, a heat pipe 320 at a vacuum state located in the evaporator 200, which allows heat to be exchanged, heat generated from the power device 100 evaporates to gas even at a low temperature. The refrigerant whose phase has changed into gas in the heat pipe 320 located in the evaporator 200 moves to the condenser 300 through the hollow heat pipe 320.

The condenser 300 is equipped to evaporate the refrigerant whose heat has been exchanged in the evaporator 200.

Composed of a condenser casing 310, the heat pipe 320, and a heat dissipation plate 330, the condenser 300 allows heat to be easily emitted outside. The condenser casing 310 has an entrance 311 through which outside air flows inside and an exit 312 through which exchanged heat is emitted outside in a form where only one side and the other side are open, wherein the entrance 311 and the exit 312 are positioned facing each other. Reinforced flanges 313 are formed at an edge of the entrance and that of the exit. This prevents the entrance 311 and the exit 312 of the condenser casing 310 from being deformed due to any external shock.

The condenser casing 310, which has width W longer than height W', is equipped to use the minimum space inside the power conditioning system. In short, it is equipped to increase space utilization rate.

To make it easy to exchange heat, the heat pipe 320 equipped in the condenser casing 310 is arranged in multiple rows repeatedly in a zigzag pattern inside the condenser casing 310. It is equipped to improve cooling performance of the heat dissipation plate 330. In other words, the cooling performance is improved in the heat pipe 320 near the exit 312 of the condenser 300 through arrangement of the heat pipe 320 in the zigzag pattern.

The heat pipe 320 is equipped to improve thermal transport capacity of the heat pipe 320 itself by being arranged vertically in the condenser casing 310.

The heat dissipation plate 330 which makes it easy to cool heat by using a phenomenon of conducting the high-temperature heat of the refrigerant in a process of passing through the heat pipe 320 is equipped to be connected to the heat pipe 320 in multiple layers.

With lots of convex or concave surfaces, the heat dissipation plate 330, in addition, is equipped to improve thermal transport performance by increasing heat dissipation area and boosting air flow with turbulence.

The heat dissipation plate 330 made of thin sheet-shaped panels have through-holes 331 of the same diameter as the heat pipe 320 at a location identical to the arrangement of the heat pipe 320 and the heat pipe 320 is inserted into, and combined with, the through-holes 331 through forced indentation and soldering. In other words, the heat pipe 320, which is being inserted into the through-hole 331, is combined or jointed with the through-hole 331 through soldering and the integration between the through-hole 331 and the heat pipe 320 may minimize contact resistance for cooling.

The condenser casing 310 has individual through or hollow holes 314, each of which the heat pipe 320 is inserted vertically into and the hollow hole 314 and the heat pipe 320 are equipped to be combined with each other through forced indentation or soldering. In other words, the heat pipe 320 which is being inserted into the hollow hole 314 of the condenser casing 310, is combined or jointed through soldering and the integration between the heat pipe 320 and the condenser casing 310 may minimize contact resistance for cooling.

If a fan, not illustrated, is equipped to the exit 312 of the condenser casing 310, this may improve a higher cooling rate.

In the apparatus for cooling a power device of a power conditioning system, the condenser 300 is first equipped on the upper side of the evaporator 200 and then rear side of the power device 100 is butted to front side of the evaporator 200. After that, the power device 100 is set to be fixed to the evaporator 200 by using screws. This allows the power device 100, the evaporator 200, and the condenser 300 to be modularized.

Next, after the modularized cooling apparatus is set to be equipped on the upper side of the power conditioning system, the evaporator 200 is placed in main frame of the power conditioning system and the condenser 300 is placed in upper frame of the power conditioning system and this work is completed. The fan not illustrated may be installed in the upper frame of the power conditioning system after the cooling apparatus is installed in the power conditioning system.

Through this process, considerable heat, which is generated from the power device in the apparatus for cooling the power device equipped on the upper side of the power conditioning system during the process of operating the power conditioning system, is cooled by the evaporator 200 placed on the rear side of the power device 100.

After that, the refrigerant heated by the evaporator 200 through heat exchange from the power device 100 is cooled by the heat dissipation plate 330 combined with the heat pipe 320 during a process of being transferred to the heat pipe 320 of the condenser 300 located on the upper side of the evaporator 200.

Next, the refrigerant condensed to a liquid by the condenser 300 prevents the temperature of the power device 100 from exceeding a certain temperature to make the system maintain the optimal operating conditions by repeating the process of being moved to the evaporator 200 through the hollow hole of the heat pipe 320.

Figure 5:
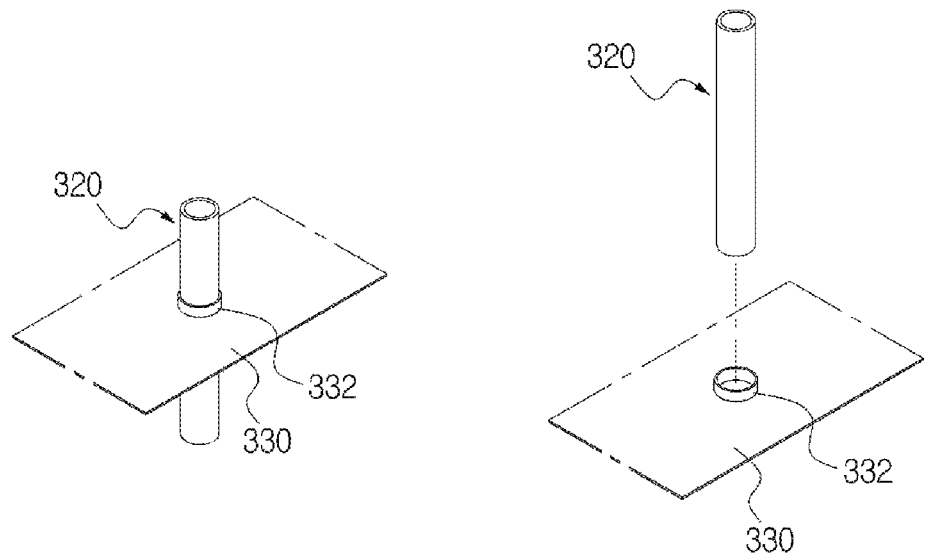
FIG. 5 is exploded views of a heat dissipation plate being combined with a heat pipe of an apparatus for cooling a power device in accordance with the present invention.

FIG. 5 shows exploded views of a heat dissipation plate being combined with a heat pipe of an apparatus for cooling a power device in accordance with the present invention.

In the present invention, the heat dissipation plate 330 has the through-hole 331 of the same diameter as the heat pipe 320 at a location identical to the arrangement of the heat pipe 320 and the heat pipe 320 is inserted vertically into, and combined with, the through-hole 331 through soldering and the combination of the heat pipe 320 and the heat dissipation plate 330 may rapidly conduct and cool heat, but as illustrated in FIG. 5 in addition to the aforementioned embodiment, the heat dissipation plate 330 has a ring spacer 332 of the same diameter protruding upward or downward as the heat pipe 320 at a location identical to the arrangement of the heat pipe 320 and the heat pipe 320 is inserted into, and combined with, the ring spacer 332 through soldering.

In this case, as a regular space between the heat dissipation plate 330 on the lower part and the heat dissipation plate 330 on the upper part is kept all the time, this may improve cooling efficiency by maintaining constant air volume that passes through the space and may make it easy to assemble the heat pipe 320 with the heat dissipation plate 330.

Figure 6:
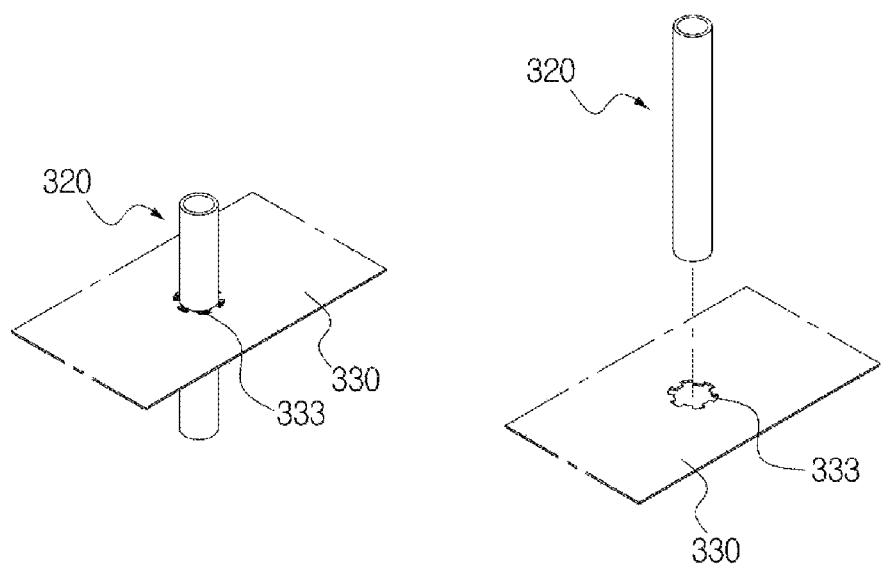
FIG. 6 is exploded views of a heat dissipation plate being combined with a heat pipe of an apparatus for cooling a power device in accordance with the present invention.

FIG. 6 shows exploded views of a heat dissipation plate being combined with a heat pipe of an apparatus for cooling a power device in accordance with the present invention.

In the present invention, the heat dissipation plate 330 has the through-hole 331 of the same diameter as the heat pipe 320 at a location identical to the arrangement of the heat pipe 320 and the heat pipe 320 is inserted vertically into, and combined with, the through-hole 331 through soldering and the combination of the heat pipe 320 and the heat dissipation plate 330 may rapidly conduct and cool heat, but as illustrated in FIG. 6 in addition to the aforementioned embodiment, the heat dissipation plate 330 has a splined hole 333 of the same diameter as the heat pipe 320 at a location identical to the arrangement of the heat pipe 320 and the heat pipe 320 is inserted into, and combined with, the splined hole 333 through soldering.

In this case, as a bonding liquid smoothly flows into a space between the splined hole 333 and the heat pipe 320 and keeps the state of bonding and attachment, it may prevent the bonded part from being detached during a process of use to lengthen their lifespan. By removing any crevice on bonded or contact area between the heat pipe 320 and the heat dissipation plate 330, thermal conductivity may be increased.

It must be noted that the aforementioned example embodiments are for explanation not for limitation. In addition, it will be understood that various changes or example embodiments of the present invention may be made by those skilled in the art within the scope of the present invention.

| * Reference Numerals | |
|---|---|
| 100: Power device | 200: Evaporator |
| 300: Condenser | 310: Condenser casing |
| 311: Entrance | 312: Exit |
| 313: Reinforced flange | 320: Heat pipe |
| 330: Heat dissipation plate | 331: Through-hole |

INDUSTRIAL AVAILABILITY

The present invention relates to an apparatus for cooling a power device of a power conditioning system, and is available in power conditioning system.

What is claimed is:

1. An apparatus for cooling a power device of a power conditioning system, comprising:
    a power device; and
    an evaporator butted to the power device; and
    a modularized condenser which is connected with the evaporator, placed on the power device, and equipped on an upper side of the power conditioning system,
    wherein the modularized condenser comprises: a condenser casing; multiple rows of heat pipes equipped in the condenser casing; and multiple layers of heat dissipation plates connecting the respective multiple rows of heat pipes,
    wherein the condenser casing has an entrance through which outside air flows inside and an exit through which exchanged heat is emitted outside in a form where only one side and the other side are open and reinforced flanges are formed at an edge of the entrance and that of the exit,
    wherein the heat pipes are arranged repeatedly in a zigzag pattern inside the condenser casing and the condenser casing has a width longer than a height, so that heat exchange performance is improved, and
    wherein each of the heat dissipation plates has: a ring spacer protruding upward or downward from a surface of each of the heat dissipation plates, each of the heat pipes is inserted into and combined with the respective spacer through soldering, so that, a regular space between the respective heat dissipation plates is maintained all the time; or
    a splined hole, and each of the heat pipes is inserted into the splined hole, and combined with, the splined hole through soldering, so that a bonding liquid smoothly flows into a space between the splined hole and the respective heat pipe.

2. The apparatus of claim 1, wherein the evaporator causes a fluid refrigerant, flowing through the respective heat pipe at a state of being decompressed to vacuum, to absorb heat generated from the power device and the refrigerant which has absorbed the heat at a gaseous state condenses through the condenser and is circulated to the evaporator.

3. The apparatus of claim 1, wherein the respective heat pipe is arranged vertically in the condenser casing.

4. The apparatus of claim 1, wherein the heat dissipation plates have at least one convex or concave surface.

* * * * *